(12) United States Patent
Wong et al.

(10) Patent No.: US 12,745,632 B2
(45) Date of Patent: Sep. 22, 2026

(54) MEMORY DEVICE AND METHOD OF ASSEMBLING SAME

(71) Applicant: Sandisk Technologies, Inc., Milpitas, CA (US)

(72) Inventors: Chee Seng Wong, Penang (MY); Yoong Tatt Chin, Penang (MY); Wei Chiat Teng, Penang (MY)

(73) Assignee: Sandisk Technologies, Inc., Milpitas, CA (US)

( * ) Notice: Subject to any disclaimer, the term of this patent is extended or adjusted under 35 U.S.C. 154(b) by 528 days.

(21) Appl. No.: 18/356,838

(22) Filed: Jul. 21, 2023

(65) Prior Publication Data

US 2024/0194560 A1 Jun. 13, 2024

Related U.S. Application Data

(60) Provisional application No. 63/386,973, filed on Dec. 12, 2022.

(51) Int. Cl.
*H10B 80/00* (2026.01)
*H10W 40/22* (2026.01)
(Continued)

(52) U.S. Cl.
CPC .......... *H10W 40/226* (2026.01); *H10B 80/00* (2023.02); *H10W 72/851* (2026.01); (Continued)

(58) Field of Classification Search
CPC ................ H10B 80/00; H10W 40/226; H10W 72/07252; H10W 72/07254; H10W 72/227; H10W 72/242; H10W 72/244; H10W 72/247; H10W 72/851; H10W 72/926; H10W 72/9415; H10W 80/312; (Continued)

(56) References Cited

U.S. PATENT DOCUMENTS 8,987,053 B2 3/2015 Upadhyayula et al.
9,275,968 B2 3/2016 Jeong et al.
(Continued)

FOREIGN PATENT DOCUMENTS

CN 112382624 A 2/2021

OTHER PUBLICATIONS

International Preliminary Report on Patentability and the Written Opinion of the International Searching Authority dated Jun. 26, 2025, International Application No. PCT/US2023/077118.

*Primary Examiner* — Telly D Green
(74) *Attorney, Agent, or Firm* — Pearl Cohen LLP

(57) ABSTRACT

Technology for a memory device having memory dies flip-chip bonded to one or more interposers that are mounted to a system board is disclosed. The memory device may be an SSD and the system board may be an M.2 board. A memory controller die may be bonded to one of the interposer boards. In one aspect, the memory controller die is flip-chip bonded to the interposer board. In one aspect, a heat sink is attached to a top surface of the flip-chip bonded controller die and to top surfaces of a group of the memory dies. Neither the memory dies nor the interposers are covered with a mold compound. Performance of the memory device is improved by, for example, lower inductance and improved heat dissipation.

15 Claims, 7 Drawing Sheets

(51) Int. Cl.

| | |
|---|---|
| ***H10W 72/00*** | (2026.01) |
| ***H10W 72/20*** | (2026.01) |
| ***H10W 80/00*** | (2026.01) |
| ***H10W 90/00*** | (2026.01) |
| *H10W 72/90* | (2026.01) |

(52) U.S. Cl.

CPC ......... *H10W 90/00* (2026.01); *H10W 90/701* (2026.01); *H10W 72/07252* (2026.01); *H10W 72/07254* (2026.01); *H10W 72/227* (2026.01); *H10W 72/242* (2026.01); *H10W 72/244* (2026.01); *H10W 72/247* (2026.01); *H10W 72/926* (2026.01); *H10W 72/9415* (2026.01); *H10W 80/312* (2026.01); *H10W 80/314* (2026.01); *H10W 80/721* (2026.01); *H10W 80/743* (2026.01); *H10W 90/726* (2026.01)

(58) Field of Classification Search

CPC ............. H10W 80/314; H10W 80/721; H10W 80/743; H10W 90/00; H10W 90/701; H10W 90/726

See application file for complete search history.

(56) References Cited

U.S. PATENT DOCUMENTS

| | | | | |
|---|---|---|---|---|
| 9,287,216 | B2 | 3/2016 | Haba et al. | |
| 10,964,682 | B2 | 3/2021 | Meyers et al. | |
| 11,145,632 | B2 | 10/2021 | Dominguez et al. | |
| 11,211,314 | B2 | 12/2021 | Kim et al. | |
| 2005/0104181 | A1 | 5/2005 | Lee et al. | |
| 2009/0166887 | A1 | 7/2009 | Upadhyayula et al. | |
| 2010/0213600 | A1 | 8/2010 | Lau et al. | |
| 2013/0009286 | A1 | 1/2013 | Kim et al. | |
| 2014/0321803 | A1* | 10/2014 | Thacker | G02B 6/4274 385/14 |
| 2014/0321804 | A1* | 10/2014 | Thacker | G02B 6/4274 385/14 |
| 2019/0244878 | A1* | 8/2019 | Kim | H01L 23/5385 |
| 2020/0006235 | A1 | 1/2020 | Aleksov et al. | |
| 2020/0211969 | A1 | 7/2020 | Hossain et al. | |
| 2020/0257517 | A1* | 8/2020 | Seater | G06F 1/3206 |
| 2022/0301971 | A1* | 9/2022 | Lin | H01L 23/5384 |

* cited by examiner

200
Interposer 206-1
Interposer 206-2
System board 203
202
204
208
210
212
214
216
218
220
222
224
226
228

300

400
Interposer 206-3
Interposer 206-4
402
404

500
System board 203
Interposer 206-1
Interposer 206-2
Interposer 206-3
Interposer 206-4
202
204
208
210
212
214
216
218
222
224
226
228
402
404
502
504

Fig. 6
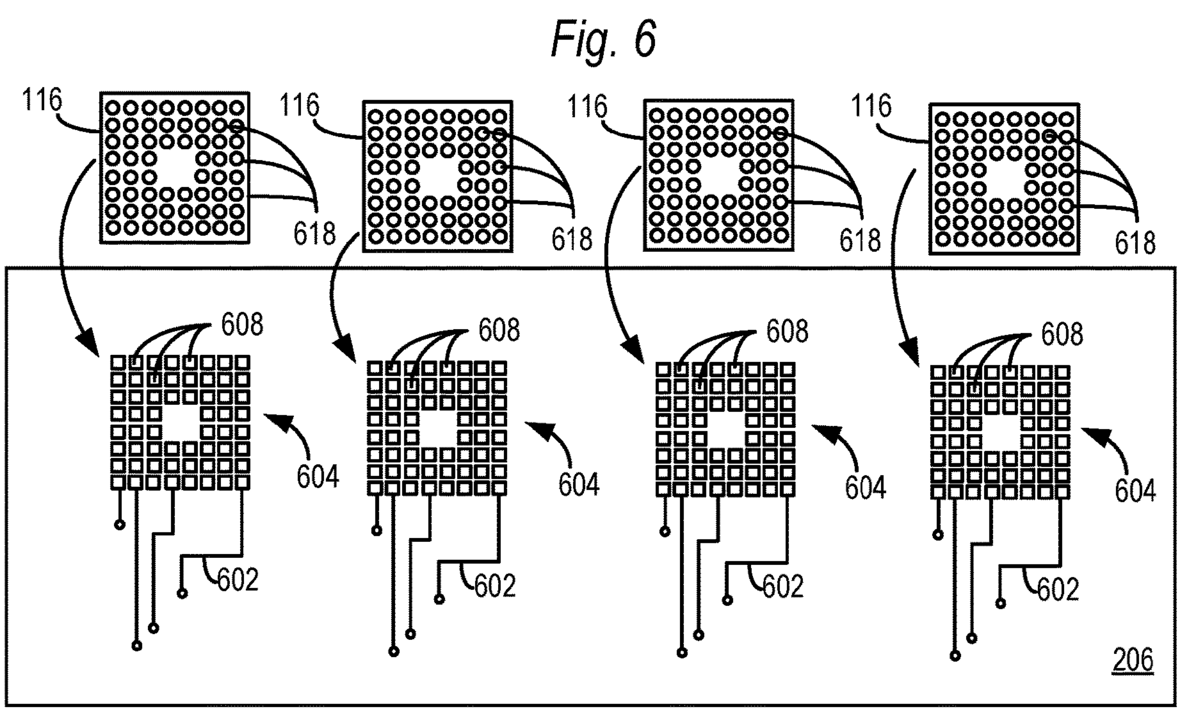
Fig. 7
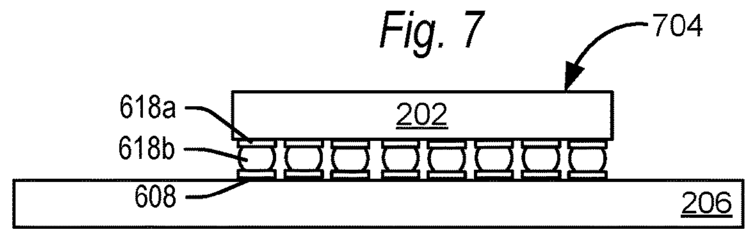
Fig. 8
202
202
202
202
602
602
602
602
206

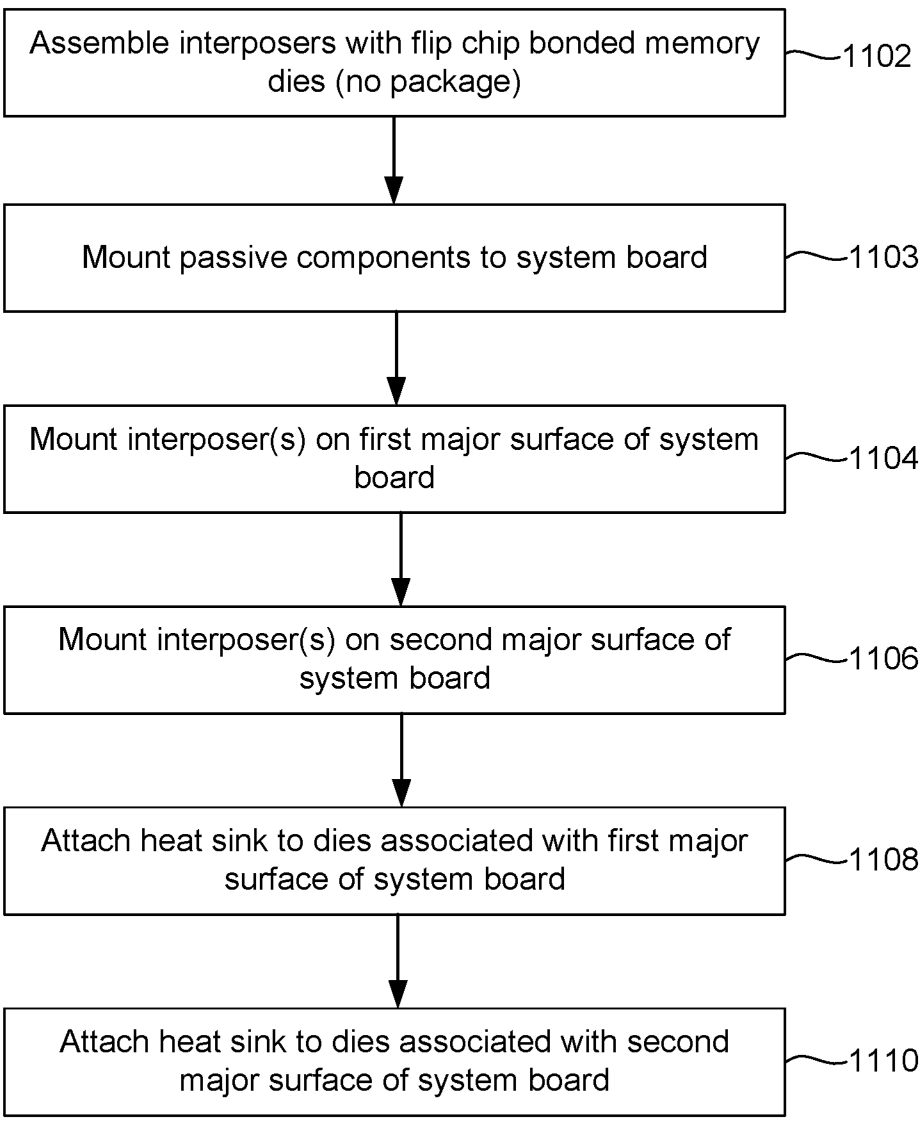
Fig. 11
1100
Assemble interposers with flip chip bonded memory dies (no package)
1102
Mount passive components to system board
1103
Mount interposer(s) on first major surface of system board
1104
Mount interposer(s) on second major surface of system board
1106
Attach heat sink to dies associated with first major surface of system board
1108
Attach heat sink to dies associated with second major surface of system board
1110

MEMORY DEVICE AND METHOD OF ASSEMBLING SAME

CLAIM OF PRIORITY

The present application claims priority from U.S. Provisional Patent Application No. 63/386,973, entitled "MEMORY DEVICE AND METHOD OF ASSEMBLING SAME," by Wong et al., filed Dec. 12, 2022, incorporated by reference herein in its entirety.

BACKGROUND

The strong growth in demand for portable consumer electronics is driving the need for high-capacity storage devices. Non-volatile semiconductor memory devices, such as flash memory storage cards, are now widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, cellular telephones and solid-state drives (SSDs).

While many varied packaging configurations are known, flash memory storage cards may be assembled as system-in-a-package (SiP) or multichip modules (MCM), where a plurality of dies are mounted and interconnected on a small footprint substrate. The substrate may include a rigid, dielectric base having a conductive layer etched on one or both sides. Electrical connections are formed between the dies and the conductive layer(s), and the conductive layer(s) provide an electric lead structure for connection of the dies to a host device. Once electrical connections between the dies and substrate are made, the assembly is then encased in a molding compound, which provides a protective package.

FIG. 1 shows a conventional memory device 100. The substrate 102 may be a variety of different chip carrier mediums, including a printed circuit board (PCB). A semiconductor die stack 104 is formed on the substrate 102. The semiconductor die stack 104 has a number of semiconductor dies 124. A die bond pad 126 is depicted on each semiconductor die 124, but each die 124 may include many more die bond pads 126. Bond wires 130 are used to electrically connect the bond pads 126 to contact pads 131 on substrate 102, thus allowing signal transfer between the substrate and the semiconductor dies 124. A memory controller die 114 resides on the substrate 102. A die bond pad 128 is depicted on the memory controller die 114, but there may be many more die bond pads 128 on the memory controller die 114. Bond wires 132 are used to electrically connect the bond pad 128 to contact pads 133 on substrate 102, thus allowing signal transfer between the substrate 102 and the memory controller die 114. The bond wires 130, 132 may be formed of gold, gold alloy or other materials.

There are a number of contact pads 108 on a bottom surface of the substrate 102. Solder balls 154 may be affixed to the contact pads 108 on the bottom surface of substrate 102. The solder balls 154 may be used to affix the memory device 100 to a host device (not shown). The memory device 100 may be encapsulated in a mold compound 142. Mold compound 142 may include for example solid epoxy resin, Phenol resin, fused silica, crystalline silica, carbon black and/or metal hydroxide.

In order to increase memory capacity yet stay within the package footprint, it is known to stack semiconductor dies on top of each other on a surface of the substrate. The dies may offset and/or overlap each other and be separated by a spacer or wire embedded film. FIG. 1 depicts one such example in which the stack 104 has four dies 124 with an offset. However, a memory device could stack even more dies. However, stacking ever more dies 124 on top of each other requires making the individual die 124 thinner to avoid the stack height from becoming too great given the package constraints. However, thinning the die 124 leads to cracks and warpage.

Moreover, the stack 104 of semiconductor dies will typically have a large number of wires (e.g., wires 130, 132) that are bonded to the substrate 102. The large number of wires contributes substantial inductance to the memory device 100.

Furthermore, the SiP process has a large number of steps including testing and packaging. These tests increase cost and time to assemble the memory device.

DESCRIPTION OF THE DRAWINGS

FIG. 6 shows a top view prior to flip-chip bonding the memory dies to the interposer board.

FIG. 7 shows a side view of one memory die after it is flip-chip bonded to the interposer board.

FIG. 8 shows a top view after flip-chip bonding the memory dies to the interposer board.

FIG. 11 is a flowchart of another embodiment of a process of assembling a memory device having a heat sink attached to dies that are flip-chip bonded to an interposer board mounted to a system board.

DETAILED DESCRIPTION

Figure 1:
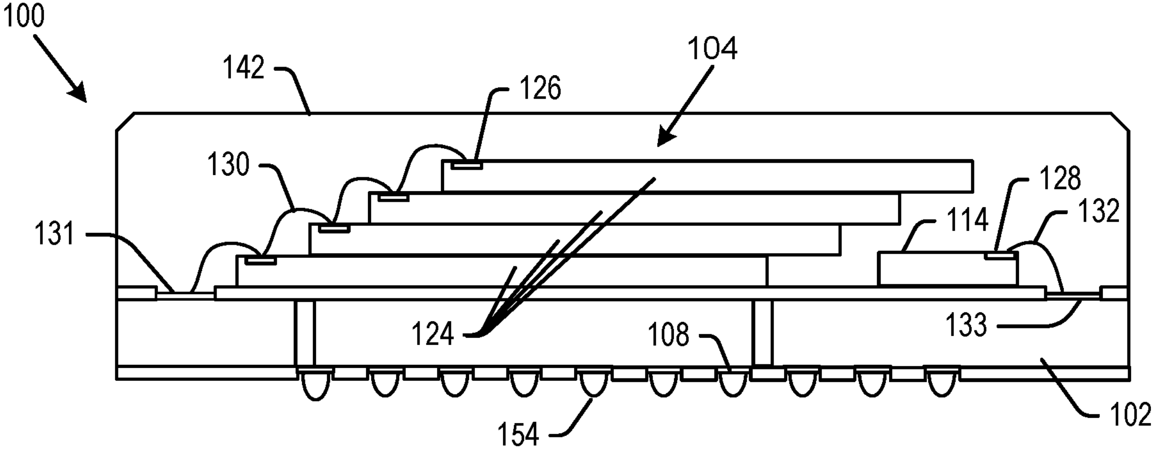
FIG. 1 shows a conventional memory device.

The present technology will now be described with reference to the figures which in embodiments relate to a memory device having memory dies flip-chip bonded to one or more interposer boards that are mounted to a system board and method of assembling the memory device. The system board may be an M.2 board, but embodiments are not limited to M.2. In an embodiment, the memory device is a solid state drive (SSD). A memory controller die may be bonded to one of the interposer boards. In one embodiment, the memory controller die is flip-chip bonded to the interposer board. In embodiments, each memory die may be what is referred to herein as a "bare die", "bare chip", "unencapsulated die", or unencapsulated chip." A bare die does not have a molding cap (e.g., solid epoxy resin, Phenol resin, fused silica, crystalline silica, carbon black and/or metal hydroxide) that is present in a packaged die. In an embodiment, the memory controller die is a bare die. In one embodiment, a heat sink is attached to a top surface of the flip-chip bonded bare controller die and to top surfaces of a group of the bare memory dies.

Because a large number of memory dies do not need to be stacked, wafer thinning is avoided. Therefore, issues such as wafer cracking and warpage are reduced or eliminated. Also some of the assembly steps and tests that are typically used for system-in-a-package (SiP) are eliminated thereby saving time and cost.

Also because the memory dies are flip-chip bonded, bond wires that are typically used when stacking memory dies are avoided. Therefore, the cost of the wires is avoided. Also, inductance is lowered, thereby improving the performance of the memory device. Also, because the memory dies may be bare, die packaging costs are saved. For example, the cost of molding compound for the package is avoided. Furthermore, for an embodiment in which a heat sink is attached to the bares dies, performance of the memory device is improved due to better heat dissipation. Even if a heat sink is not used, heat dissipation of bare dies is more effective than packaged dies.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application.

For purposes of this disclosure, a connection may be a direct connection or an indirect connection (e.g., via one or more other parts). In some cases, when a first element is referred to as being connected, affixed, mounted or coupled to a second element, the first and second elements may be directly connected, affixed, mounted or coupled to each other or indirectly connected, affixed, mounted or coupled to each other. When a first element is referred to as being directly connected, affixed, mounted or coupled to a second element, then there are no intervening elements between the first and second elements (other than possibly an adhesive or melted metal used to connect, affix, mount or couple the first and second elements).

FIGS. 2-5 depict embodiments of a memory device such as a solid state drive (SSD). In embodiments, memory dies are flip-chip bonded to a substrate (e.g., interposer 206 in any of FIG. 2-5). In an embodiment, each memory die may be what is referred to herein as a "bare die", "bare chip", "unencapsulated die", or unencapsulated chip." A bare die does not have a plastic molding cap that is present in a packaged die.

Figures 2, 3, 4:
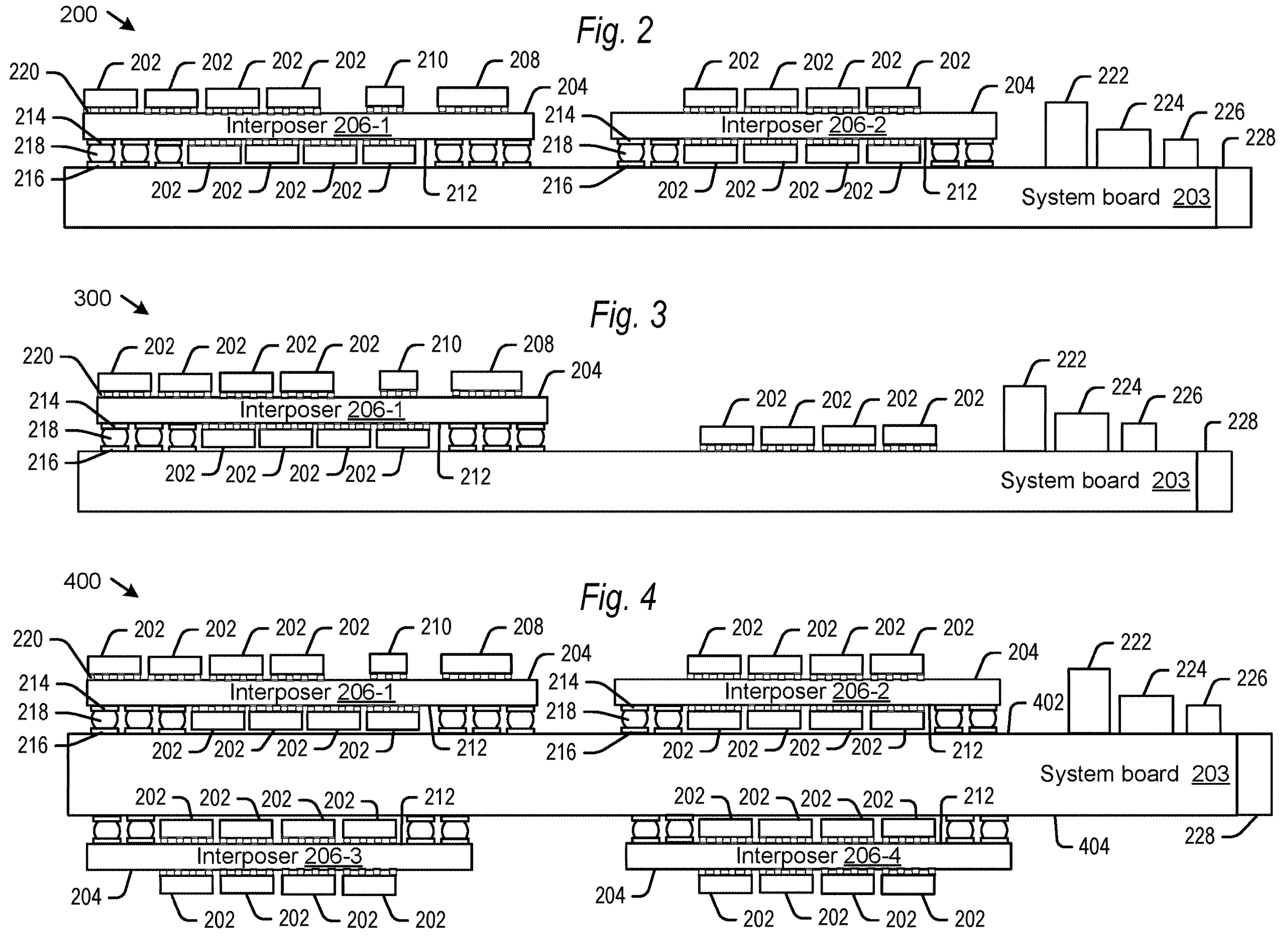
FIG. 2 is a diagram of one embodiment of a memory device having memory die flip-chip bonded on an interposer board that is mounted to a system board.
FIG. 3 is a diagram of one embodiment of a memory device having memory die flip-chip bonded on an interposer board that is mounted to a system board, and additional memory dies directly bonded to the system board.
FIG. 4 depicts a memory device in which two major surfaces of the system board are used for mounting interposer boards having flip-chip bonded memory dies.

FIG. 2 is a diagram of one embodiment of a memory device 200. In one embodiment, the memory device 200 is an SSD. The memory device 200 has a number of memory die 202. Each memory die 202 contains memory cells. The memory cells could be volatile or non-volatile. In an embodiment, each memory die 202 contains one or more memory structures and peripheral circuitry that controls chip level operations such as read, write, and erase. The type of memory cells can include, but are not limited to, flash NAND, ReRAM (resistive random access memory), magnetoresistive memory (e.g., MRAM, Spin Transfer Torque MRAM, Spin Orbit Torque MRAM), FeRAM, and phase change memory (e.g., PCM). Examples of suitable technologies for memory cell architectures of the memory structure in the memory die 202 include two dimensional arrays, three dimensional arrays, cross-point arrays, stacked two dimensional arrays, vertical bit line arrays, and the like. The memory device 200 has a memory controller die 208. The memory controller die 208 is in communication with all of the memory dies 202. The memory controller die 208 may be, for example, an ASIC for controlling transfer of signals and data to and from the memory dies 202.

The memory device 200 has system board 203. The system board 203 is a signal-carrier medium provided for transferring electrical signals between semiconductor dies mounted on and in the system board 203 and a host device. The system board 203 may be a printed circuit board (PCB), including those having edge connectors for connecting to a host device such as a motherboard. The system board 203 may be a PCB having solder balls for soldering the system board 203 to a host device such as a motherboard or other PCB. The system board 203 may have a specific form factor. The system board 203 may be an M.2 board, but is not limited to M.2 (formerly known as Next Generation Size (NGFF)). In one embodiment, the memory device 200 is an M.2 SSD. The system board 203 may have a connector 228 that provides a physical and electrical connection to, for example, a host. Therefore, data can be transferred between the host and the memory dies 202. The connector 228 may have a wide variety of form factors including, but not limited to, SATA (Serial Advanced Technology Attachment), SAS (Serial Attached Small Computer Systems Interface), PCIe (Peripheral Component Interconnect express). The memory controller 208 controls the writing (storage) of data received on the interface 228 into the memory dies 202. The memory controller die 208 controls the reading of data stored in the memory dies 202 and provides that data over connector 228 to the host. The memory controller die 208 may encode the data prior to storage and decode (and error correct) the data prior to transferring to the host. In an embodiment, a cover is not needed over the components in any of FIGS. 2-5. For example, the M.2 SSD form factor does not require a cover. Moreover, in an embodiment, neither the interposer boards 206 nor the system board 203 are covered with a mold compound. Optionally, a cover or the like may be added over the components in FIG. 2, but the cover is not required. For example, a cover could be added for EMI (electromagnetic interference) protection in some operating environments.

The memory device 200 of FIG. 2 has a first interposer board 206-1 (or more briefly "interposer") and a second interposer board 206-2. The interposer boards 206 are substrates to which components are attached. The interposers 206 are directly mounted to the system board 203, such as with solder balls 220, as will be discussed below. A number of the memory dies 202 are flip-chip bonded to a primary side (or first major surface) 204 of the first interposer board 206-1. The memory controller die 208 is also directly mounted to the primary side 204 of the first interposer 206-1. Also, a power management integrated circuit (PMIC) 210 is directly mounted to the primary side 204 of the first interposer 206-1. A number of memory dies 202 also are flip-chip bonded to a secondary side (or second major surface) 212 of the first interposer 206-1. The first interposer 206-1 is directly mounted to the system board 203. In an embodiment, a ball grid array (BGA) is used to directly mount the first interposer 206-1 to the system board 203. There are a number of contact pads 214 on the secondary side 212 of the first interposer 206-1. There are a like number of contact pads 216 on a top surface of the substrate 102. Solder balls 218 may be used to electrically connect pairs of contact pads 214, 216.

A second interposer 206-2 is also directly mounted to the system board 203 in a similar manner as the first interposer 206-1. A number of memory dies 202 are flip-chip bonded to the primary side 204 of the second interposer 206-2. Also, a number of memory dies 202 are flip-chip bonded to the secondary side 212 of the second interposer 206-2. In this example, only memory dies 202 are attached to the second interposer 206-1. That is, the second interposer 206-2 does not include a controller die or a PMIC.

Additional components 222, 224, 226 are directly mounted to the system board 203. The additional components 222, 224, 226 could be passive components such as resistors, capacitors, inductors, etc. However, the additional components 222, 224, 226 are not limited to being passive components. The system board 203 may be connected to a host (not shown) by way of the connector 228. In accordance with an embodiment of the invention, one of skill in the art will note that neither the memory dies 202 nor the interposers 206 of the memory device 200 include any mold compound that covers any of the memory dies 202.

FIG. 3 is a diagram of one embodiment of a memory device 300. In an embodiment, the memory device is an SSD. A first interposer 206-1 as shown and described with respect to memory device 200 is directly mounted to the system board 203. A number of additional memory dies 202 are directly mounted to the system board 203. The elements of memory device 300 that are in common with the memory device 200 in FIG. 2 will not be discussed again. In an embodiment, the additional memory dies 202 are flip-chip bonded to the system board 203.

In some embodiments, two major surfaces of the system board 203 may be used for directly mounting interposers 206. FIG. 4 depicts a memory device 400 in which two major surfaces of the system board 203 are used for directly mounting interposers 206. Interposers 206-1 and 206-2 are directly mounted to a first major surface 402 of the system board 203. Interposers 206-3 and 206-4 are directly mounted to a second major surface 404 of the system board 203. Interposers 206-3 and 206-4 are similar to interposer 206-2, each with a number of memory dies 202 flip-chip mounted to a primary side 204 and secondary side 212. In an embodiment, the memory device 400 is an SSD. The elements of memory device 400 that are in common with the memory device 200 in FIG. 2 will not be discussed again.

Figure 5:
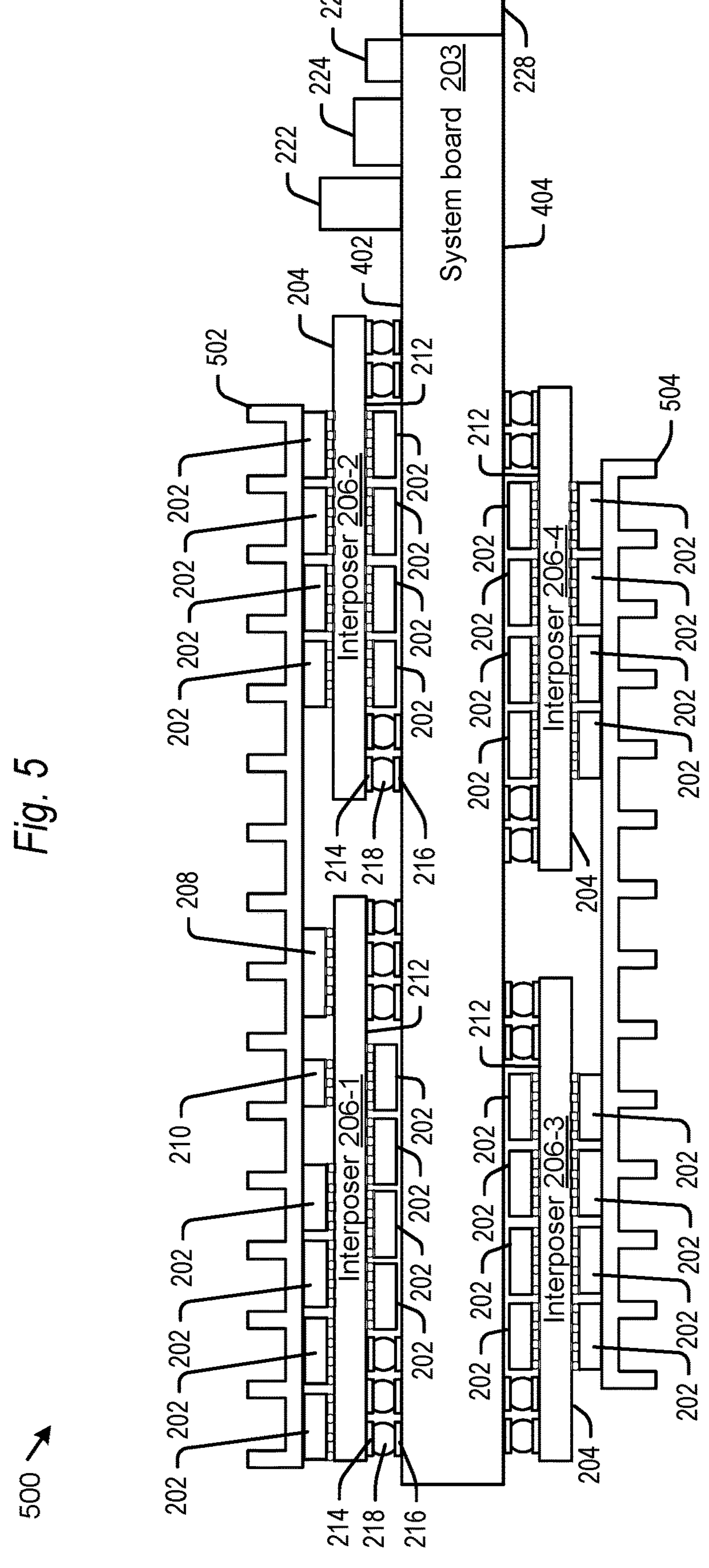
FIG. 5 is a diagram of a memory device having heat sinks attached to memory dies flip-chip bonded on an interposer board.

In some embodiments, one or more heat sinks are attached to top surfaces of the memory controller die 208 and the memory dies 202. FIG. 5 is a diagram of a memory device 500 having two heat sinks. In an embodiment, the memory device 500 is an SSD. A first heat sink 502 is attached to top surfaces of the memory dies 202 on the primary side 204 of first interposer 206-1, the top surfaces of memory dies 202 on the primary side 204 of second interposer 206-2, the memory controller die 208 on the primary side 204 of first interposer 206-1, and the power management IC 210 on the primary side 204 of first interposer 206-1. A second heat sink 504 is attached to top surfaces of the memory dies 202 on the primary side 204 of third interposer 206-3 and the top surfaces of memory dies 202 on the primary side 204 of fourth interposer 206-4. Each heat sink 502, 504 is thermally coupled (or in thermal contact) to the respective die top surfaces in order to cool the memory controller die 208, the memory dies 202, and/or the power management IC 210. Note that the dies 202, 208 may be unencapsulated dies for better heat transfer. The heat sinks 502, 504 may be directly attached to the dies 202, 208 in that there are no intervening components other than adhesives (e.g., epoxy), thermal interface materials, or the like that are used to attach the heat sink and/or aid in heat transfer. The memory controller die 208 may generate more heat than an individual memory die 202. Flip-chip mounting the memory controller die 208 and attaching the heat sink 502 thereto provides an effective way to cool the memory controller die 208. The elements of memory device 500 that are in common with the memory device 200 in FIG. 2 will not be discussed again. While the heat sinks 502 and 504 are shown as finned heat sinks, the fins are not required, and the dimensions of the heat sinks may be determined based on the overall physical dimensions specified for the memory device 500.

FIGS. 6-8 provide further details for an embodiment of flip-chip bonding to the interposer board 206. In an embodiment, the memory dies 202 are flip-chip bonded to the interposer board 206. In an embodiment, the memory controller die 208 is flip-chip bonded to the interposer board 206. FIGS. 6-8 will be discussed with respect to four memory dies 202 flip-chip bonded to one side of the interposer 206. FIG. 6 shows a top view prior to flip-chip bonding four memory dies 202 to the interposer 206. FIG. 7 shows a side view of one memory die 202 after it is flip-chip bonded to the interposer 206. FIG. 8 shows a top view after flip-chip bonding the four memory dies 202 to the interposer 206. This example is consistent with the four memory dies 202 flip-chip bonded to primary side 204 of interposer 206-2, 206-3, or 206-4. A similar technique may be used to flip-chip bond the memory controller die 208 to an interposer 206. The interposer 206 has four conductance patterns 604. Each conductance pattern 604 has a cluster of contact pads 608. Each memory die 202 may include a cluster of bump pads 618 configured to mate with a corresponding cluster of contact pads 608 on the interposer 206. The cluster of "bump pads" 618 are on a face of the memory die 202. The memory die 202 may be referred to as a "flip-chip semiconductor die". There may be many more bump pads 618 and contact pads 608 in the respective clusters than are shown in FIG. 6. With reference to FIG. 7, each bump pad 618 may include a solder bump 618*b*, which may be adhered to an electrical contact 618*a* on the face of the die 202 during a semiconductor wafer fabrication step. The solder bumps 618*b* may thus be added to the face of the die 202 prior to bonding to the interposer 206. The key aspects of flip chip die creation are the bump layout and RDL (redistributed layer) design. The parameters considered are bump size, bump pitch, bump pattern/layout, RDL line width, and RDL spacing. In some embodiments, the bump pattern/layout is optimized for the underfill process.

In order to attach the memory dies 202 to interposer 206, each memory die 202 is inverted from the position shown in FIG. 6 so that the cluster of bump pads 618 mates with the corresponding cluster of contact pads 608 on interposer 206. The solder bumps 618*b* are then melted and cured in an oven using a reflow process. Optionally, an electrically-insulating adhesive may be underfilled into any space between the memory die 202 and the interposer 206 around the solder bumps 618*b* to provide a stronger mechanical connection, provide a heat bridge, and to reduce stress on the solder joints due to differential heating of the chip and the substrate. Electrical traces 602 on the interposer 206 connect to various contact pads 608. The traces 602 and contact pads 608 shown are by way of example, and the interposer 206 may include more traces 602 and/or contact pads 608 than is shown in the figures, and they may be in different locations than is shown in the figures. Note that flip-chip bonding of a die 202, 208 to the interposer board 206 results in a direct connection of the die 202, 208 to the interposer board 206 in that there are no intervening components between the die 202, 208 and the interposer board 206 other than, for example, solder bumps 618*b* or other elements that provide the electrical bond.

Mounting the memory dies 202 on the interposer 206 using a flip-chip configuration allows many memory dies to be included in the memory device without using a stack of memory dies 116. Therefore, problems with wafer thinning leading to wafer cracks and wafer warpage are reduced or eliminated. Other advantages are the elimination of bond wires, shorter interconnect lengths, better electrical performance and lower noise, high packaging density, high I/O counts, and smaller package/device footprint.

In an embodiment, each memory die 202 may be what is referred to herein as a "bare die", "bare chip", "unencapsulated die", or "unencapsulated chip." A bare die does not have a plastic molding cap that is present in a package die. FIG. 7 shows the top surface 704 of one of the memory dies 202 facing away from the interposer 206. This top surface 704 may be referred to herein as a "bare top surface" or "unencapsulated top surface" in that the die is a bare or unencapsulated die without a molding cap. In some embodiments, a heat sink is thermally coupled to the bare top surface 704 to cool the memory die 202. In a similar manner, the memory controller die 208 may be flip-chip bonded to the interposer 206. The heat sink may also be thermally coupled to a bare top surface of the memory controller die 208 to cool the memory controller die 208.

Figure 9:
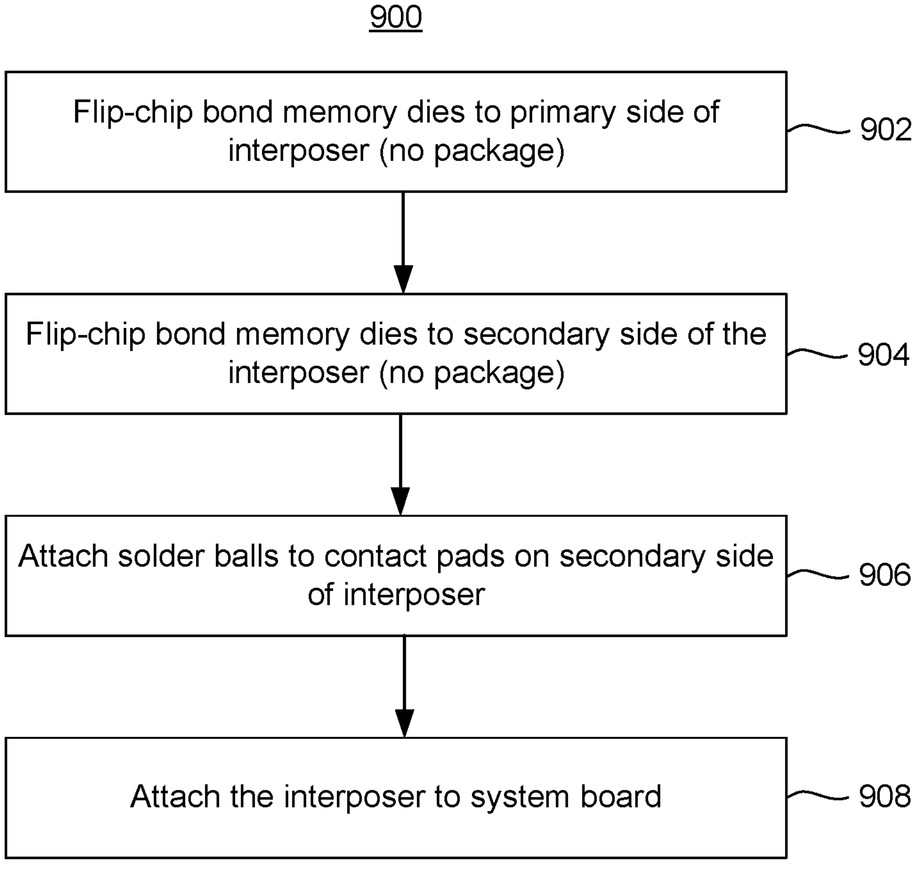
FIG. 9 is a flowchart of one embodiment of a process of assembling a memory device having memory dies flip-chip bonded to an interposer board mounted to a system board.

FIG. 9 is a simplified flowchart of one embodiment of a process 900 of assembling a memory device. The memory device may be an SSD. In an embodiment, the memory device is an M.2 SSD. Process 900 illustrates a flow in which the memory device has one or more interposers such as interposer 206-1, 206-2, 206-3 or 206-4. Process 900 will be discussed with an example of one of the interposers (e.g., any of 206-1, 206-2, 206-3, 2060-4), which will be referred to as interposer 206. Step 902 includes flip-chip bonding memory dies 202 to the primary side 204 of the interposer 206. In one embodiment, for each memory die 202 of a first set of memory dies 202, step 902 includes placing the cluster of bump pads 618 on the memory die 202 in contact with the corresponding cluster of contact pads 608 on the primary side 204 of the interposer 206 and performing a solder reflow. However, techniques other than solder reflow including, but not limited to, compression bonding technology and laser soldering may be used in step 902. In an embodiment, a memory controller die 208 and a PMIC 210 are attached to the primary side 204 of the interposer (e.g., interposer 206-1). Process 900 is not limited to any particular technique for adding the memory controller die. Further details of adding the memory controller die 208 and a PMIC 210 are discussed in connection with FIG. 10.

Step 904 includes flip-chip bonding more memory dies 202 to the secondary side 212 of the interposer 206. In one embodiment, for each memory die 202 of a second set of memory dies 202, step 904 includes placing the cluster of bump pads 618 on the memory die 202 in contact with the corresponding cluster of contact pads 608 on the secondary side of the interposer 206 and performing a solder reflow. However, other techniques including, but not limited to, compression bonding technology and laser soldering may be used in step 904. In steps 902 and 904 the memory dies 202 may be bare dies, which are not in a package (e.g., no package). Also, the order of steps 902 and 904 may be reversed.

Step 906 includes attaching solder balls 218 to contact pads 214 on the secondary side 212 of the interposer 206. Step 908 includes attaching the interposer 206 directly to the system board 203. Step 908 includes mating the solder balls 218 with contact pads 216 on the system board 203 and performing a solder reflow process. The interposer 206 may be attached to either a single major surface (e.g., 402 or 404) of the system board 203 or to both major surfaces 402, 404 of the system board 203. Other elements, such as passive components (e.g., 222, 224, 226) may also be added to the system board 203. It will be understood that some steps are not depicted in FIG. 9. For example, an electrically-insulating adhesive may be underfilled into any space between the memory dies 202 and the interposer 206 around the solder bumps 618*b*.

Figure 10:
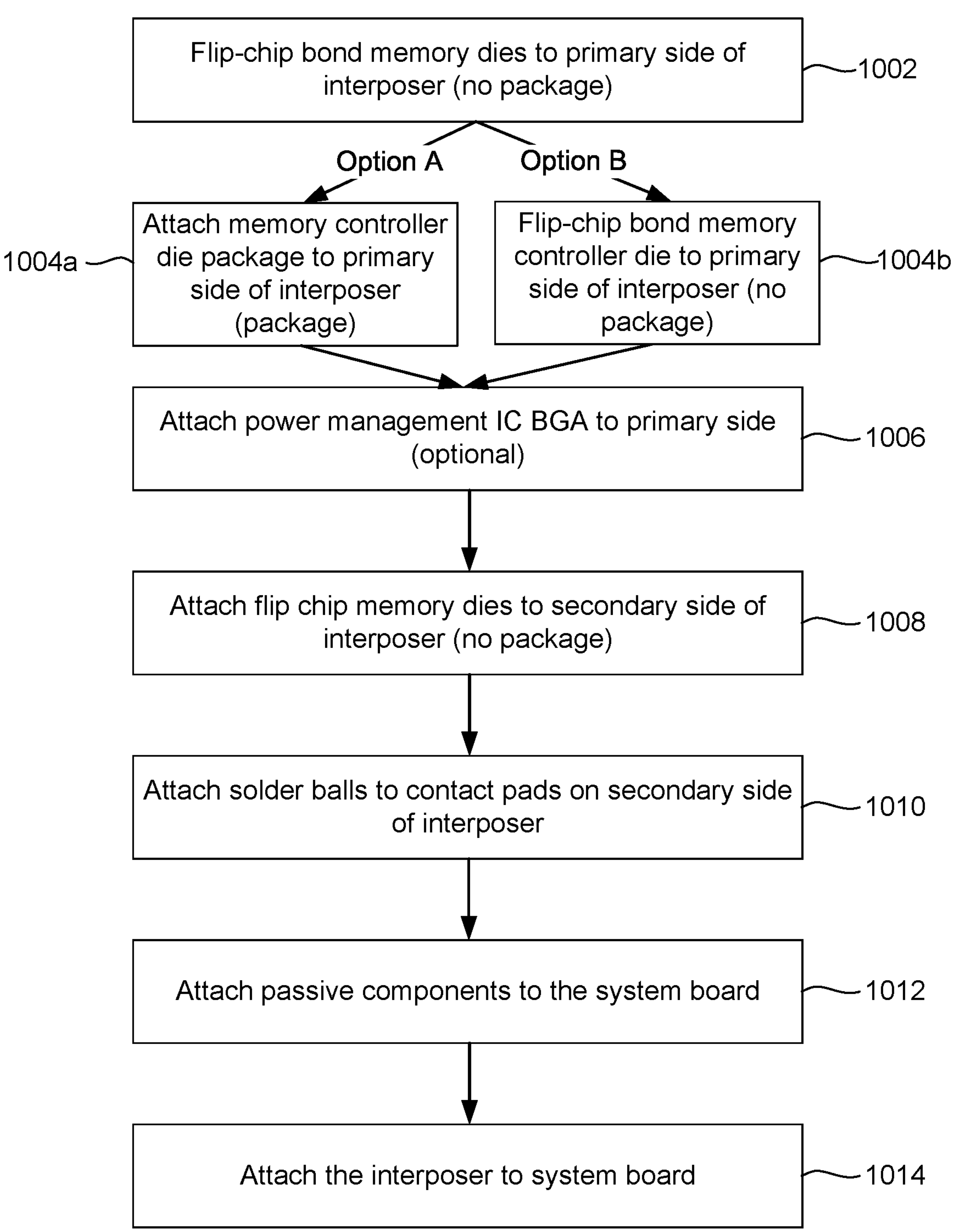
FIG. 10 is a flowchart of another embodiment of a process of assembling a memory device having memory dies and a memory controller die flip-chip bonded to an interposer board mounted to a system board.

FIG. 10 is a flowchart of another embodiment of a process 1000 of assembling a memory device. The memory device may be an SSD. In an embodiment, the memory device is an M.2 SSD. Process 1000 describes a flow in which the memory device has an interposer such as interposer 206-1. Process 900 may be used to attach additional interposers such interposers 206-2, 206-2, 206-3 to the system board (see step 1014). Step 1002 includes flip-chip bonding memory dies 202 to a primary side 204 of the interposer 206-1. Step 1002 may be similar to step 902 in FIG. 9. Thus, step 1002 may include a solder reflow process, but other techniques may be used to bond the cluster of bump pads 618 on the respective memory dies 202 with the corresponding cluster of contact pads 608 on the primary side of the interposer 206-1. In step 1002 the memory dies 202 are bare dies, which are not in a package (e.g., no package).

Step 1004 includes attaching a memory controller die 208 to the primary side of the interposer 206-1. Process 1000 has two options for adding the memory controller die 208. In Option A (step 1004*a*) the memory controller die 208 is in a package, e.g., a BGA package. In one embodiment of step 1004*a*, the memory controller die 208 is in a Flip Chip, Chip Scale Package (FCCSP); however, other packaging may be used. In Option B (step 1004*b*) the memory controller die 208 is not in a package (no package)—that is, the memory controller die 208 is a bare die that has bumps. Thus, the controller die 208 has a cluster of bump pads similar to the cluster of bump pads 618 of the memory dies (but the pattern will likely be different). The cluster of bump pads of the memory controller die 208 are placed into contact with a corresponding cluster of contact pads 608 on the primary side of the interposer 206-1 and then, in an embodiment, a solder reflow is performed. In an embodiment, this is the same solder reflow process as is used in step 1002 to flip chip bond the memory dies 206 to the primary side of interposer 206-1. However, other techniques including, but not limited to, compression bonding technology and laser soldering may be used to flip-chip bond the memory controller die 208 to the interposer 206-1.

Step 1006 includes attaching a power management IC to the primary side 204 of the interposer 206. Step 1008 includes flip-chip bonding memory dies 202 to a secondary side 204 of the interposer 206-1. Step 1008 may be similar to step 904 in FIG. 9. Thus, step 1006 may include a reflow process, but other techniques may be used to bond the cluster of bump pads 618 on the respective memory dies 202 with the corresponding cluster of contact pads 608 on the secondary side of the interposer 206. Step 1008 may be performed prior to steps 1002-1006. In step 1008 the memory dies 202 may be bare dies, which are not in a package (e.g., no package).

Step 1010 includes attaching solder balls 218 directly to contact pads 214 on the secondary side of the interposer 206-1, which will allow the interposer 206-1 to be directly connected to the system board 203. Step 1012 includes attaching passive components directly to the system board 203. In one embodiment, additional memory dies 202 are flip-chip bonded to the system board 203. Step 1014 includes attaching the interposer 206-1 directly to the system board 203. Step 1014 includes mating the solder balls 218 of interposer 206-1 with contact pads 216 on the system board 203 and, in an embodiment, performing a solder reflow process. Step 1014 may also include attaching additional interposers 206-2, 206-3, 206-4 directly to the system board 203 as described in steps 906-908 of FIG. 9. It will be understood that some steps are not depicted in FIG. 10. For example, an electrically-insulating adhesive may be underfilled into any space between the flip-chip mounted memory dies 202 and flip-chip mounted control die 208 and the interposer 206-1 around the solder bumps.

FIG. 11 is a flowchart of another embodiment of a process 1100 of assembling a memory device. Process 1100 describes a flow for assembling a memory device having one or more heat sinks. Step 1102 includes assembling interposers 206 having flip-chip bonded memory dies 202. Step 1102 may include assembling interposers 206 such as interposers 206-1, 206-2, 206-3, and/or 206-4. Step 1102 may include several solder reflow steps. In one embodiment, for each side of each interposer 206, a separate solder reflow is performed to flip-chip bond dies to the respective side. For example, a solder reflow is performed to flip-chip bond memory dies 202 and memory controller die 208 to the primary side 204 of interposer 206-1. Another solder reflow is performed to flip-chip bond memory dies 202 to the secondary side 212 of interposer 206-1. Note that the order of these reflow steps may be revered with the secondary side being performed prior to the primary side 204. In step 1102, preferably the memory dies 202 are bare dies, which are not in a package (e.g., no package). In an embodiment, the memory controller die 208 is a bare die. Step 1103 includes mounting components directly to the system board 203.

Step 1104 includes directly mounting one or more of the interposers 206 to a first major surface 402 of the system board 203. In one embodiment, step 1104 includes attaching solder balls 218 to contact pads 214 on the secondary sides 212 of the respective interposers 206-1, 206-2, mating the solder balls 218 with contact pads 216 on the first major surface 402 of the system board 203, and performing a solder reflow process. Step 1106 includes directly mounting one or more of the interposers 206 to a second major surface 404 of the system board 203. In one embodiment, step 1106 includes attaching solder balls 218 to contact pads 214 on the secondary sides 212 of the respective interposers 206-3, 206-4, mating the solder balls 218 with contact pads 216 on the second major surface 404 of the system board 203, and performing a solder reflow process. The order of steps 1104 and 1106 may be reversed.

Step 1108 includes attaching a heat sink 502 to dies associated with the first major surface 402. For example, heat sink 502 is attached to memory dies 202 and memory control die 208 on interposer 206-1. Heat sink 502 may also be attached to memory dies 202 on interposer 206-2. The heat sink 502 may be thermally coupled to a top surface of the memory controller die 208 and thermally coupled to top surfaces of a set of the memory dies 202. The heat sink 502 is attached after the reflows (see steps 1102, 1104, 1106) using adhesives (e.g., epoxy), thermal interface materials, or the like. Step 1110 includes attaching a heat sink 504 to dies associated with the second major surface 404. For example, heat sink 504 is attached to memory dies 202 and memory control die 208 on interposer 206-3 and interposer 206-4. The heat sink 504 may be thermally coupled to top surfaces of a set of the memory dies 202. The heat sink 504 is attached after the reflows (see steps 1102, 1104, 1106) using adhesives (e.g., epoxy), thermal interface materials, or the like.

In summary, in one example, the present technology relates to a memory device comprising a system board having an interface configured to connect to a host and an interposer board directly mounted to the system board. The interposer board comprises a plurality of conductance patterns. Each conductance pattern includes a cluster of contact pads. The memory device comprises a plurality of memory dies flip-chip bonded to the interposer board. Each memory die comprises memory cells. Each memory die comprises a cluster of bump pads on a face of the memory die. For each particular memory die the cluster of bump pads of the particular memory die are electrically bonded to the cluster of contact pads of one of the conductance patterns of the interposer board.

In a further example, the plurality of memory dies are bare dies.

In a further example, the memory device further comprises a memory controller die bonded to the interposer board. The memory controller die is in communication with the plurality of memory dies and is configured to control storage of data received on the interface of the system board in the plurality of memory dies.

In a further example, the memory controller die is flip-chip bonded to the interposer board. The memory controller die comprises a cluster of bump pads on a face of the memory controller die. The cluster of bump pads of the memory controller die are electrically bonded to the cluster of contact pads of one of the conductance patterns of the interposer board.

In a further example, the interposer board comprises a primary side and a secondary side. The primary side faces away from the system board. The secondary side faces the system board. The memory controller die is directly flip-chip bonded to the primary side of the interposer board. The memory controller die is a bare die.

In a further example, a heat sink is thermally coupled to an unencapsulated top surface of the memory controller die and thermally coupled to unencapsulated top surfaces of a set of the plurality of memory dies that are flip-chip bonded to the primary side of the interposer board. The unencapsulated top surface of the memory controller die and the unencapsulated top surfaces of the set of the memory dies face away from the system board.

In a further example, the interposer board comprises a primary side and a secondary side. The plurality of memory dies comprise a first plurality of memory dies flip-chip bonded to the primary side of the interposer board and a second plurality of memory dies directly flip-chip bonded to the secondary side of the interposer board.

In a further example, the memory device further comprises additional memory dies flip-chip bonded to the system board, wherein the additional memory dies are unencapsulated dies.

In a further example, the memory device further comprises one or more additional interposer boards directly mounted to the system board. The memory device further comprises additional memory dies flip-chip bonded to the one or more additional interposer boards. The additional memory dies are bare dies.

In a further example, the system board has a first major surface and a second major surface. At least one of the interposer boards is directly mounted to the first major surface. At least one of the interposer boards is directly mounted to the second major surface. Neither the interposer boards nor the system board are covered with a mold compound.

In a further example, the system board comprises an M.2 board.

One embodiment includes a method for assembling a solid state drive (SSD). The method comprises flip-chip bonding a first group of bare memory dies directly to a primary side of an interposer board, flip-chip bonding a second group of bare memory dies directly to a secondary side of the interposer board. Each memory die in the first group and the second group comprises non-volatile memory cells. The method comprises mounting the interposer board directly to a system board.

One embodiment includes a solid state drive (SSD). The SSD comprises a substrate means including substrate contact means for providing an electrical contact to the substrate means. The substrate means includes means for transferring data between the SSD and a host. The SSD comprises a plurality of interposer means directly mounted to the substrate means, wherein each of the interposer means comprises first sets of interposer-die contact means on a primary side of the interposer means and second sets of interposer-die contact means on a secondary side of the interposer mean. Each of the interposer means comprises interposer-substrate contact means on the secondary side of the interposer means. The interposer-substrate contact means are bonded to the substrate contact means. The SSD includes a plurality of memory dies each comprising non-volatile memory cells. Each memory die comprises die bond means on a face of the memory die. The plurality of memory dies comprise a first set of memory dies each having the face directly mounted to the primary side of one of the plurality of interposer means with the die bond means electrically bonded to a set of the first set of interposer-die contact means. The plurality of memory dies comprising a second set of memory dies each having the face directly mounted to the secondary side of one of the plurality of interposer means with the die bond means electrically bonded to a set of the second set of interposer-die contact means.

In an embodiment, the substrate means comprises one or more of a system board 203, a printed circuit board (PCB), or an M.2 board. In an embodiment, the means for providing an electrical contact to the substrate means includes contact pads 216. In an embodiment, the means for transferring data between the solid state storage system and a host includes one or more of connector 228, a SATA (Serial Advanced Technology Attachment) interface, a SAS (Serial Attached Small Computer Systems Interface) interface, or a PCIe (Peripheral Component Interconnect express) interface. In an embodiment the interposer means comprises interposer board 206. In an embodiment the interposer-die contact means includes a cluster of contact pads 608. In an embodiment the interposer-substrate contact means includes contact pads 214. In an embodiment the die bond means include cluster of bump pads 618 and/or solder bumps 618*b*.

In a further embodiment, the SSD includes a memory controller die having a face directly mounted to the primary side of one of the plurality of interposer means. The memory controller die comprises memory controller bond means on the face of the memory controller die. The memory controller bond means are bonded to a set of the first set of interposer-die contact means. In an embodiment, the memory controller bond means include cluster of bump pads 618 and/or solder bumps 618*b*.

In a further embodiment, the SSD includes means for exchanging heat, wherein the means for exchanging heat is thermally coupled to a top surface of the memory controller die and to top surfaces of a set of the memory dies. The top surface of the memory controller die is opposite to the face of the memory controller die, wherein the top surface of each respective memory dies is opposite to the face of the respective memory die. In an embodiment the means for exchanging heat includes heat sink 502.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A memory device comprising:

a system board having an interface configured to connect to a host, the system board has a first major surface and a second major surface;

a plurality of interposer boards directly mounted to the system board, at least one of the interposer boards is directly mounted to the first major surface, at least one of the interposer boards is directly mounted to the second major surface, wherein each interposer board comprises a plurality of conductance patterns, each conductance pattern including a cluster of contact pads, wherein neither the plurality of interposer boards nor the system board are covered with a mold compound; and a plurality of memory dies flip-chip bonded to each interposer board, wherein the plurality of memory dies are bare dies, wherein each memory die comprises memory cells, wherein each memory die comprises a cluster of bump pads on a face of the memory die, wherein for each particular memory die the cluster of bump pads of the particular memory die are electrically bonded to the cluster of contact pads of one of the conductance patterns of the interposer board.

2. The memory device of claim 1, further comprising:

a memory controller die bonded to the interposer board, wherein the memory controller die is in communication with the plurality of memory dies and is configured to control storage of data received on the interface of the system board in the plurality of memory dies.

3. The memory device of claim 2, wherein:

the memory controller die is flip-chip bonded to the interposer board;

the memory controller die comprises a cluster of bump pads on a face of the memory controller die; and the cluster of bump pads of the memory controller die are electrically bonded to the cluster of contact pads of one of the conductance patterns of the interposer board.

4. The memory device of claim 3, wherein:

the interposer board comprises a primary side and a secondary side, the primary side faces away from the system board, the secondary side faces the system board;

the memory controller die is flip-chip bonded to the primary side of the interposer board; and the memory controller die is a bare die.

5. The memory device of claim 4, further comprising:

a heat sink thermally coupled to an unencapsulated top surface of the memory controller die and thermally coupled to unencapsulated top surfaces of a set of the plurality of memory dies that are flip-chip bonded to the primary side of the interposer board, wherein the unencapsulated top surface of the memory controller die and the unencapsulated top surfaces of the set of the memory dies face away from the system board.

6. The memory device of claim 1, wherein:

the interposer board comprises a primary side and a secondary side; and the plurality of memory dies comprise a first plurality of memory dies flip-chip bonded to the primary side of the interposer board and a second plurality of memory dies flip-chip bonded to the secondary side of the interposer board.

7. The memory device of claim 1, further comprising:

additional memory dies flip-chip bonded to the system board, wherein the additional memory dies are unencapsulated dies.

8. The memory device of claim 1, wherein the system board comprises an M.2 board.

9. A method for assembling a solid state drive (SSD), the method comprising:

flip-chip bonding a first group of bare memory dies directly to a primary side of a first interposer board, wherein the first interposer board comprises a plurality of conductance patterns, each conductance pattern including a cluster of contact pads, wherein each memory die in the first group comprises a cluster of bump pads on a face of the memory die, the flip-chip bonding the first group including for each particular memory die electrically bonding the cluster of bump pads of the particular memory die to the cluster of contact pads of one of the conductance patterns of the interposer board;

flip-chip bonding a second group of bare memory dies directly to a secondary side of the first interposer board, wherein each memory die in the first group and the second group comprises non-volatile memory cells, wherein each memory die in the second group comprises a cluster of bump pads on a face of the memory die, the flip-chip bonding the second group including for each particular memory die electrically bonding the cluster of bump pads of the particular memory die to the cluster of contact pads of one of the conductance patterns of the first interposer board;

flip-chip bonding a third group of bare memory dies directly to a primary side of a second interposer board, wherein the second interposer board comprises a plurality of conductance patterns, each conductance pattern including a cluster of contact pads, wherein each memory die in the third group comprises a cluster of bump pads on a face of the memory die, the flip-chip bonding the first group including for each particular memory die electrically bonding the cluster of bump pads of the particular memory die to the cluster of contact pads of one of the conductance patterns of the second interposer board;

mounting the first interposer board directly to a first major surface of a system board having an interface configured to connect to a host; and mounting the second interposer board directly to a second major surface of the system.

10. The method of claim 9, further comprising:

flip-chip bonding a memory controller die directly to the primary side of the first interposer board, wherein the memory controller die is in communication with the first group of memory dies and the second group of memory dies, wherein the memory controller die is a bare die.

11. The method of claim 10, further comprising:

attaching a heat sink in thermal contact with top surfaces of the first group of bare memory dies and with a top surface of the memory controller die after directly mounting the secondary side of the first interposer board to the system board.

12. The method of claim 10, wherein flip-chip bonding the memory controller die directly to the primary side of the interposer board comprises:

forming a conductance pattern on the primary side of the first interposer board, the conductance pattern including a cluster of contact pads; and affixing the memory controller die directly to the primary side of the first interposer board in a flip chip arrangement in which a cluster of bump pads on the memory controller die is electrically bonded to the cluster of contact pads of the conductance pattern on the primary side of the first interposer board.

13. A solid state drive (SSD), the SSD comprising:

a substrate means including substrate contact means for providing an electrical contact to the substrate means, the substrate means including means for connecting to and transferring data between the SSD and a host, the system substrate means has a first major surface and a second major surface;

a plurality of interposer means directly mounted to the substrate means, at least one of the interposer means is directly mounted to the first major surface, at least one of the interposer means is directly mounted to the second major surface, wherein each of the interposer means comprises a plurality of first clusters of interposer-die contact means on a primary side of the interposer means and a plurality of second clusters of interposer-die contact means on a secondary side of the interposer means, wherein each of the interposer means comprises interposer-substrate contact means on the secondary side of the interposer means, wherein the interposer-substrate contact means are directly connected to the substrate contact means, wherein neither the plurality of interposer means nor the substrate means are covered with a mold compound; and a plurality of bare memory dies each comprising non-volatile memory cells, wherein each memory die comprises a cluster of die bond means on a face of the memory die, the plurality of memory dies comprising a first set of memory dies each having the face directly mounted to the primary side of one of the plurality of interposer means with the cluster of die bond means electrically bonded to a particular cluster of the first clusters of interposer-die contact means, the plurality of memory dies comprising a second set of memory dies each having the face directly mounted to the secondary side of one of the plurality of interposer means with the die bond means electrically bonded to a particular cluster of the second clusters of interposer-die contact means.

14. The solid state drive of claim 13, further comprising:

a memory controller die having a face directly mounted to the primary side of one of the plurality of interposer means, the memory controller die comprising memory controller bond means on the face of the memory controller die, wherein the memory controller bond means are bonded to a particular cluster of the first clusters of interposer-die contact means, wherein the memory controller die is a bare die.

15. The solid state drive of claim 14, further comprising:

means for exchanging heat, wherein the means for exchanging heat is thermally coupled to a top surface of the memory controller die and to top surfaces of the first set of the memory dies, wherein the top surface of the memory controller die is opposite to the face of the memory controller die, wherein the top surface of each respective memory die is opposite to the face of the respective memory die.

* * * * *